(12) United States Patent
Abawi

(10) Patent No.: US 8,717,773 B2
(45) Date of Patent: May 6, 2014

(54) MULTI-PLATE BOARD EMBEDDED CAPACITOR AND METHODS FOR FABRICATING THE SAME

(75) Inventor: Daniel Z. Abawi, Gardnerville, NV (US)

(73) Assignee: General Electric Company, Schenectady, NY (US)

( * ) Notice: Subject to any disclaimer, the term of this patent is extended or adjusted under 35 U.S.C. 154(b) by 53 days.

(21) Appl. No.: 13/040,841

(22) Filed: Mar. 4, 2011

(65) Prior Publication Data

US 2012/0224333 A1 Sep. 6, 2012

(51) Int. Cl.
*H05K 1/18* (2006.01)
*H05K 1/14* (2006.01)

(52) U.S. Cl.
USPC ........... 361/763; 361/735; 361/736; 361/738; 361/807; 361/811

(58) Field of Classification Search
USPC ............ 361/761, 763, 679.01, 807, 811, 728, 361/729, 735, 736, 738, 748, 760
See application file for complete search history.

(56) References Cited

U.S. PATENT DOCUMENTS

| | | | | |
|---|---|---|---|---|
| 5,103,283 A | * | 4/1992 | Hite | 257/724 |
| 5,774,326 A | * | 6/1998 | McConnelee et al. | 361/313 |
| 6,252,760 B1 | * | 6/2001 | Sen | 361/306.3 |
| 6,344,951 B1 | * | 2/2002 | Sato et al. | 360/316 |
| 6,410,960 B1 | * | 6/2002 | Arai et al. | 257/347 |
| 6,459,561 B1 | * | 10/2002 | Galvagni et al. | 361/306.3 |
| 6,907,658 B2 | * | 6/2005 | Li | 29/832 |
| 6,909,593 B2 | * | 6/2005 | Kuroda et al. | 361/306.3 |
| 6,961,230 B2 | * | 11/2005 | Otsuka et al. | 361/306.2 |
| 8,125,761 B2 | * | 2/2012 | Hsu et al. | 361/306.1 |
| 2002/0085334 A1 | * | 7/2002 | Figueroa et al. | 361/301.4 |
| 2004/0118602 A1 | | 6/2004 | Lee et al. | |
| 2004/0184219 A1 | * | 9/2004 | Otsuka et al. | 361/306.3 |
| 2005/0121224 A1 | * | 6/2005 | Lien | 174/250 |
| 2007/0121273 A1 | * | 5/2007 | Yamamoto et al. | 361/306.2 |
| 2007/0234539 A1 | | 10/2007 | Lee et al. | |
| 2007/0290321 A1 | | 12/2007 | Sundstrom | |
| 2008/0157701 A1 | * | 7/2008 | Kato | 315/363 |
| 2008/0239685 A1 | * | 10/2008 | Kawabe et al. | 361/782 |
| 2010/0244585 A1 | * | 9/2010 | Tan et al. | 307/109 |
| 2011/0084607 A1 | * | 4/2011 | Hopper et al. | 315/53 |

FOREIGN PATENT DOCUMENTS

| | | |
|---|---|---|
| EP | 1260998 | 11/2002 |
| EP | 1695947 | 8/2006 |

OTHER PUBLICATIONS

European Search Report dated Sep. 5, 2013.

* cited by examiner

*Primary Examiner* — Hoa C Nguyen
(74) *Attorney, Agent, or Firm* — Fletcher Yoder P.C.

(57) ABSTRACT

A printed wiring board (PWB) including one or more embedded capacitors. The PWB defines a planar area and includes a plurality of first conductive plates that are substantially parallel to the planar area and extend from a first normal axis towards a second normal axis. The first normal axis and the second normal axis extend substantially perpendicularly through the planar area. The PWB also includes one or more second conductive plates that are substantially parallel to the planar area and extend from the second normal axis towards the first normal axis. The second conductive plates are positioned between the first conductive plates. A non-conductive material is positioned between the first and second conductive plates. At least one first conductive via extends substantially collinear with the first normal axis in contact with the first conductive plates. A plurality of second conductive vias extends substantially collinear with the second normal axis in contact with the second conductive plate.

20 Claims, 3 Drawing Sheets

MULTI-PLATE BOARD EMBEDDED CAPACITOR AND METHODS FOR FABRICATING THE SAME

BACKGROUND OF THE INVENTION

The subject matter disclosed herein relates generally to capacitors and, more specifically, to multi-plate capacitors embedded within printed wiring boards (PWBs), also known as printed circuit boards (PCBs).

Electronic devices generally include a variety of components, including capacitors, mounted to a PWB. At least some known PWBs include an embedded capacitor that uses conductive layers of the PWB (e.g., a ground plane and a power plane) as capacitor plates. Such an embedded capacitor may eliminate the need to mount a capacitor to a surface of the PWB. However, at least some known embedded capacitors require a relatively large portion of the PWB to be dedicated to the capacitor, or require that the PWB be sized sufficiently to achieve a desired capacitance. Such a design may be infeasible for a smaller-sized PWB, such as a PWB designed for use in a mobile electronic device. In such a PWB, the capacitor may occupy so much of the PWB that insufficient space remains for other electronic components to be mounted on the PWB. Moreover, known embedded capacitors may exhibit a relatively high inductance, such that the capacitor becomes ineffective at high frequencies (e.g., above 40 megahertz). In addition, a conventional surface-mounted capacitor may be subjected to physical stress as the surface-mounted capacitor and the underlying PWB expand at different rates, whereas a capacitor embedded within a PWB may expand at substantially the same rate as the PWB to which it is mounted.

BRIEF DESCRIPTION OF THE INVENTION

This Brief Description is provided to introduce a selection of concepts in a simplified form that are further described below in the Detailed Description. This Brief Description is not intended to identify key features or essential features of the claimed subject matter, nor is it intended to be used as an aid in determining the scope of the claimed subject matter.

In one aspect, a printed wiring board (PWB) defining a substantially planar area is provided. The PWB includes a plurality of first conductive plates oriented substantially parallel to the planar area and extending from a first normal axis towards a second normal axis. The first and second normal axes are oriented substantially perpendicular to the planar area. The PWB also includes a second conductive plate oriented substantially parallel to the planar area and extending from the second normal axis towards the first normal axis. The second conductive plate extends between an adjacent pair of the first conductive plates. The PWB further includes a non-conductive material extending between the second conductive plate and the first conductive plates, and a plurality of first conductive vias aligned substantially collinear with the first normal axis and in contact with at least one of the first conductive plates.

In another aspect, a printed wiring board (PWB) defining a substantially planar area and including a PWB-embedded capacitor mounted to the planar area is provided. The PWB-embedded capacitor occupies a portion of the planar area and includes a plurality of first conductive plates extending from a first normal axis towards a second normal axis. The first normal axis and the second normal axis are oriented substantially perpendicular to the planar area within the occupied portion of the planar area. The PWB-embedded capacitor also includes a plurality of second conductive plates extending from the second normal axis towards the first normal axis and interleaved with the first conductive plates. The PWB-embedded capacitor further includes a non-conductive material disposed between the first conductive plates and the second conductive plates and a plurality of first conductive vias coupling the first conductive plates.

In yet another aspect, a method for producing a capacitor embedded within a printed wiring board (PWB) is provided. The method includes creating a plurality of first substantially overlapping conductive plates within the PWB. A plurality of second substantially overlapping conductive plates is created within the PWB. The second conductive plates are interleaved with the first conductive plates and substantially overlap the first conductive plates. A non-conductive material is positioned between the first conductive plates and the second conductive plates such that the first conductive plates do not contact the second conductive plates. The first conductive plates are electrically coupled with a plurality of first conductive vias.

BRIEF DESCRIPTION OF THE DRAWINGS

The embodiments described herein may be better understood by referring to the following description in conjunction with the accompanying drawings.

DETAILED DESCRIPTION OF THE INVENTION

As used herein, a printed wiring board (PWB), also known as a printed circuit board (PCB), is a structure including one or more layers of non-conductive material. Electronic components, such as integrated circuits (ICs), logic gates, transistors, and/or capacitors may be coupled (e.g., by soldering) to a surface of the PWB. Such electronic components may be electrically coupled to each other using conductors, known as "traces", that are positioned on the non-conductive material. Some PWBs include multiple layers of non-conductive material, such that multiple layers of traces may be stacked by positioning the traces on the different layers of the PWB, with the non-conductive material insulating the traces on different layers from each other. In addition, one or more conductors, known as "vias", may extend between different layers of the PWB to couple a trace to another trace on a different layer and/or to an electronic component.

The embodiments described herein provide multi-plate capacitors that are embedded within a PWB. Two sets of interleaved, or alternately stacked, conductive plates may be created on layers of non-conductive material within the PWB. The conductive plates of each set may be electrically coupled to each other (e.g., using a conductive via). Accordingly, when an electrical potential difference (i.e., a voltage) is applied across the two sets of conductive plates, the non-conductive material acts as a dielectric, and electrical energy may be stored in a static electric field within the dielectric.

Embedding a multi-plate capacitor within a PWB as described herein facilitates reducing the effect of thermal expansion on the performance and/or longevity of a capacitor.

At least in part because of the physical characteristics (e.g., permittivity) of the non-conductive material within the PWB and/or because of multiple conductive vias are included, providing an embedded capacitor as described herein may facilitate reducing the inductance exhibited by a capacitor and enable the use of such a capacitor at higher switching rates (i.e., frequencies) than are feasible with conventional capacitors. For example, a multi-plate embedded capacitor may be effective above 40 megahertz.

Figure 1:
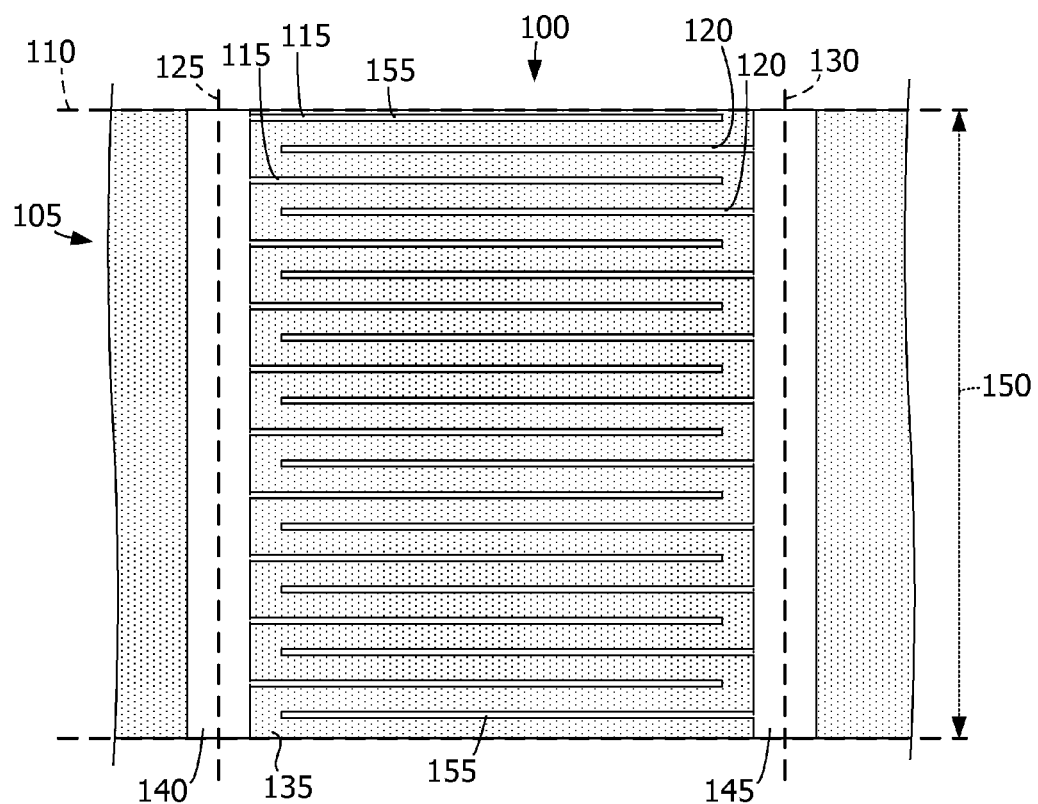
FIG. 1 is a diagram of a cross-section of an exemplary embedded capacitor.

FIG. 1 is a diagram of a cross-sectional view of an exemplary embedded capacitor 100. In the exemplary embodiment, capacitor 100 is embedded within a PWB 105 that defines a planar area 110 (indicated by a horizontal plane in FIG. 1). Capacitor 100 includes a plurality of first conductive plates 115 and at least one second conductive plate 120 that are aligned substantially parallel to planar area 110. More specifically, first conductive plates 115 extend from a first normal axis 125 towards a second normal axis 130. Each second conductive plate 120 extends from second normal axis 130 towards first normal axis 125. Both first normal axis 125 and second normal axis 130 are substantially perpendicular to planar area 110.

Each second conductive plate 120 is positioned between a respective pair of first conductive plates 115. In an exemplary embodiment, capacitor 100 includes a plurality of second conductive plates 120 that are interleaved with (e.g., alternately positioned with) first conductive plates 115. In one embodiment, capacitor 100 includes n first conductive plates and n second conductive plates 120. In such an embodiment, n−1 second conductive plates 120 are positioned between each respective pair of first conductive plates 115, and a single second conductive plate 120 is positioned adjacent to a single first conductive plate 115. In another embodiment, capacitor 100 includes n first conductive plates 115 and n−1 second conductive plates 120. In such an embodiment, each second conductive plate 120 is positioned between a pair of first conductive plates 115.

A non-conductive material 135 extends between first conductive plates 115 and second conductive plates 120. Non-conductive material 135 may also be positioned between first conductive plates 115 and second normal axis 130, and/or between second conductive plates 120 and first normal axis 125. Accordingly, in each embodiment, first conductive plates 115 are not direct against and/or do not contact second conductive plates 120. In an exemplary embodiment, non-conductive material 135 is a dielectric, such as FR-4, and first conductive plates 115 and second conductive plates 120 are composed of copper. Alternatively first conductive plates 115 and second conductive plates 120 may be composed of any suitable electrically conductive material.

In the exemplary embodiment, capacitor 100 also includes at least one first conductive via 140 that is aligned substantially collinear with first normal axis 125 and that contacts first conductive plates 115, and at least one second conductive via 145 that is aligned substantially collinear with second normal axis 130 and that contacts second conductive plates 120.

The quantity, shape, dimensions, and/or spacing of first conductive plates 115 and/or second conductive plates 120 may be variably selected based on a desired capacitance level for capacitor 100. For example, increasing the quantity and/or size of first conductive plates 115 and/or second conductive plates 120 generally facilitates increasing the capacitance of capacitor 100. In some embodiments, capacitor 100 includes between 4 and 40 first conductive plates 115 and between four and forty second conductive plates 120.

Capacitor 100 occupies at least a portion of the thickness or height 150 of PWB 105. In some embodiments, first conductive plates 115 and second conductive plates 120 are stacked approximately to PWB thickness 150. The outermost conductive plates 155 of capacitor 100 may be covered by non-conductive material 135 to facilitate reducing the risk of accidental electrical contact with capacitor 100.

Figure 2:
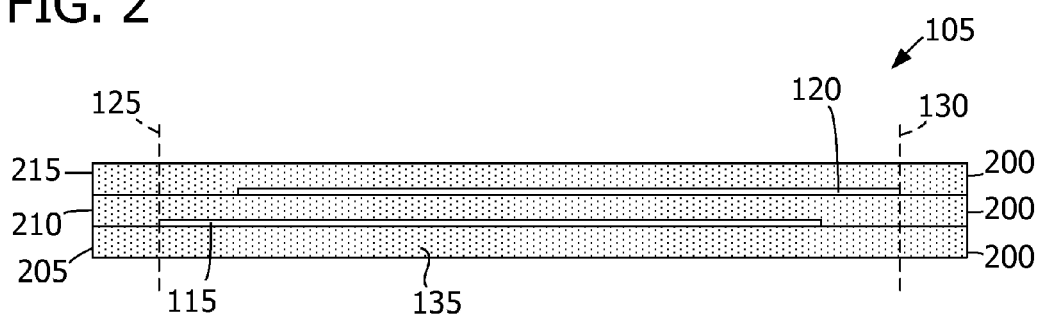
FIG. 2 is a diagram illustrating a plurality of layers formed within a PWB according to one embodiment.
Figure 3:
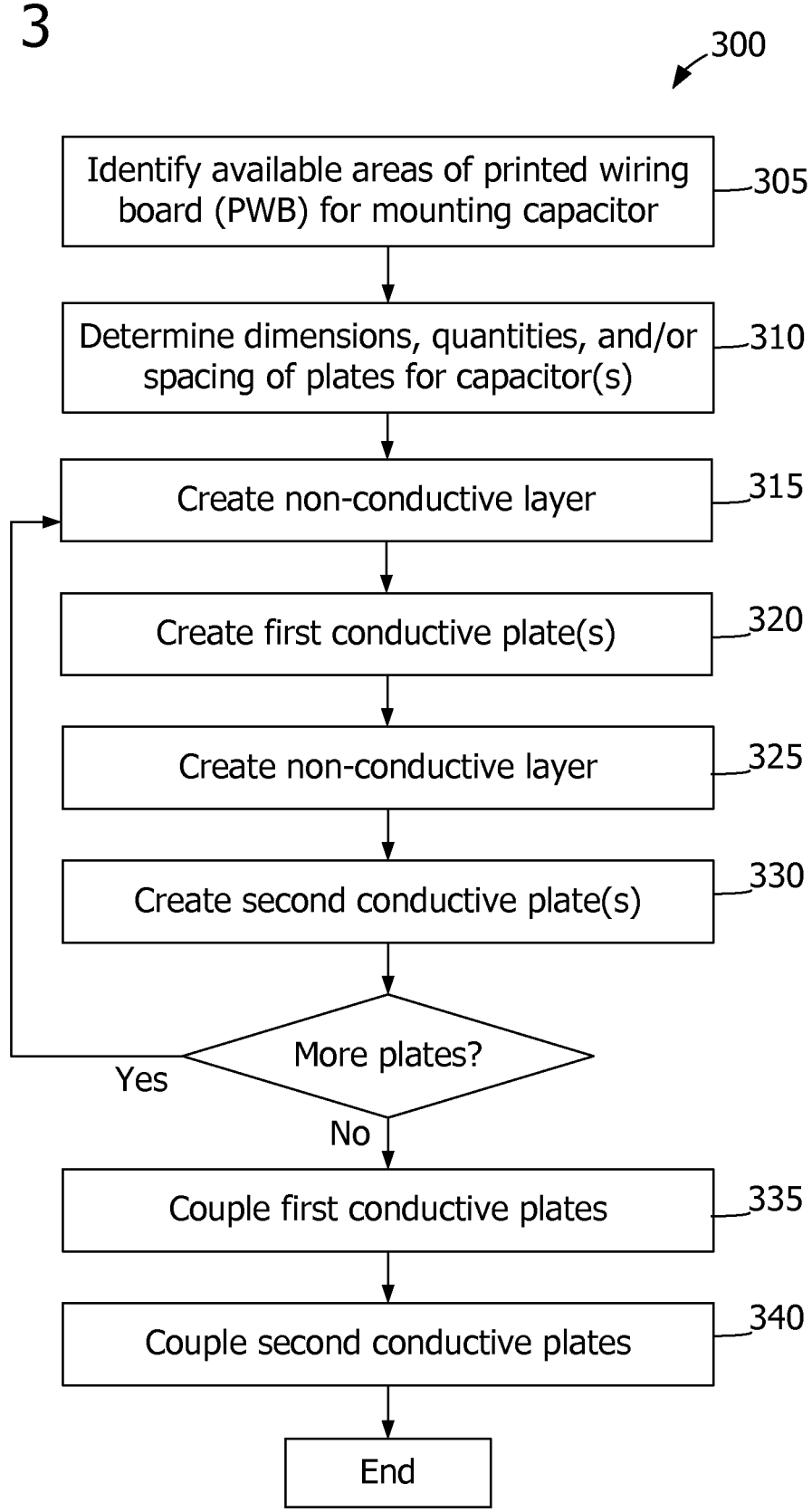
FIG. 3 is a flowchart of an exemplary method for creating one or more capacitors that are embedded within a PWB.

In some embodiments, a capacitor is created that includes layers of non-conductive material 135 with conductive plates positioned thereon. FIG. 2 is a diagram showing an exemplary plurality of layers 200 within PWB 105. FIG. 3 is a flowchart of an exemplary method 300 that may be used to create capacitors 100 that are embedded within PWB 105. In the exemplary embodiment, initially, one or more available areas 405 (shown in FIG. 4) of a PWB to which capacitor 100 will be mounted are determined 305, as described in more detail below. If no portion of the PWB is allocated for mounting electronic components, the entirety of the PWB may be considered available. Otherwise, available areas 405 may be selected depending on the position and/or the size of electronic components to be coupled to PWB 105.

The dimensions, quantities, and/or spacing of conductive plates 115, 120 to include in a capacitor 100 are then determined 310. For example, if a desired capacitance is known, the dimensions, quantities, and/or spacing of the conductive plates 115, 120 may be determined 310 based at least in part on the desired capacitance, the available areas of the PWB to which capacitor 100 will be mounted, the quantity of layers within PWB 105, and/or physical characteristics (e.g., permittivity) of the non-conductive material 135 within PWB 105.

In the exemplary embodiment, a first non-conductive layer 205 is created 315, and a first conductive plate 115 is extended across 320 at least a portion of first non-conductive layer 205. For example, first conductive plate 115 may be created 320 by applying a copper material across a portion of first non-conductive layer 205. First conductive plate 115 extends from first normal axis 125 towards second normal axis 130. A second non-conductive layer 210 may be created 325. For example, a dielectric may be applied over first conductive plate 115 to create 325 second non-conductive layer 210.

A second conductive plate 120 is created 330 on second non-conductive layer 210. In the exemplary embodiment, second conductive plate 120 extends from second normal axis 130 towards first normal axis 125.

First conductive plate 115 and second conductive plate 120 form a pair of conductive plates that may be used by themselves as a capacitor. Alternatively, multiple pairs of conductive plates may be stacked by creating 315 another conductive layer over second conductive plate 120, creating 320 another first conductive plate 115, creating 325 another non-conductive layer, and creating 330 another second conductive plate 120. This process may be repeated to create any desired quantity of conductive plates. Optionally, a third non-conductive layer 215 may be applied over the topmost conductive plate (e.g., second conductive plate 120). Such an embodiment facilitates insulating the topmost conductive plate from accidental electrical contact.

In an exemplary embodiment, first conductive plates 115 are electrically coupled 335 to each other, and second conductive plates 120 are electrically coupled 340 to each other. For example, first conductive plates 115 may be electrically coupled 335 by extending one or more first conductive vias 140 (shown in FIGS. 1 and 4) substantially along, or adjacent to, first normal axis 125, such that the first conductive via 140 physically contacts first conductive plates 115. Similarly, second conductive plates 120 may be electrically coupled 340 by extending second conductive vias 145 (shown in FIGS. 1 and 4) substantially along, or adjacent to, second normal axis 130.

As described in more detail below, some embodiments facilitate creating multiple embedded capacitors 100 in a single PWB 105. For example, multiple embedded capacitors 100 may be stacked in PWB 105. In some embodiments, stacked embedded capacitors 100 are separated by one or more non-conductive layers. Such separation may reduce propagation of an electric charge from one embedded capacitor 100 to another. In addition to, or in the alternative, multiple sets of first conductive plates 115 and second conductive plates 120 may be created in different portions of the planar area 110 of PWB 105. In such an embodiment, a conductive plate for each embedded capacitor 100 may be created 320 on first non-conductive layer 205 prior to creating 325 second non-conductive layer 210.

Figure 4:
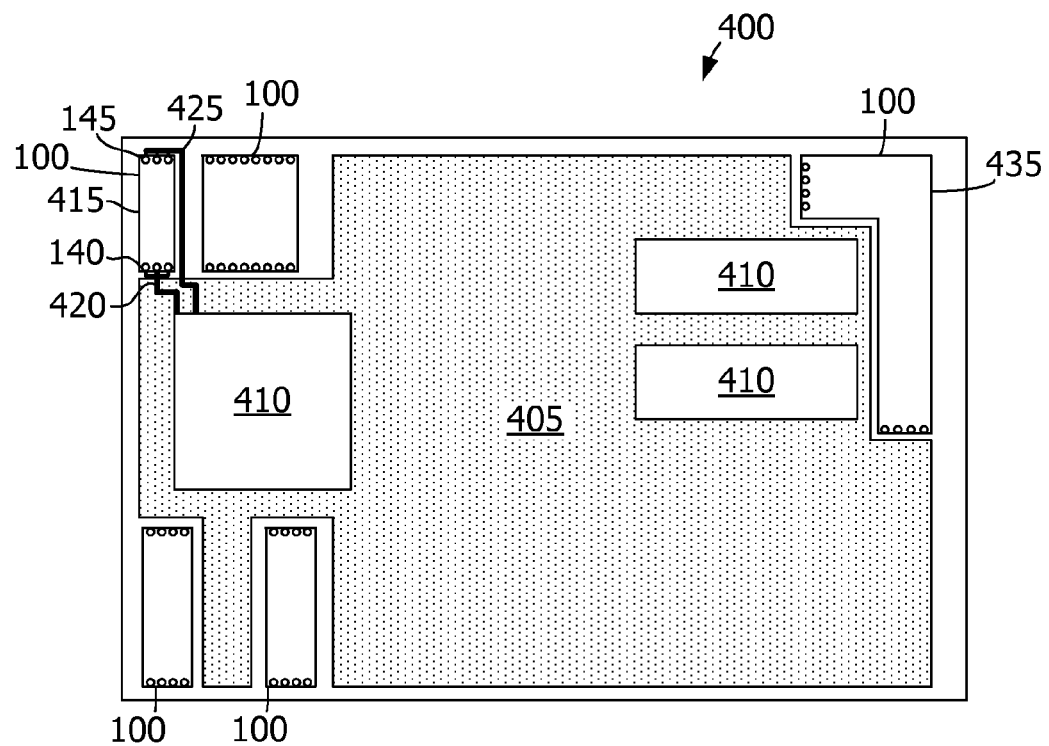
FIG. 4 is an overhead view of an exemplary PWB that includes a plurality of PWB-embedded capacitors.

FIG. 4 is a plan view of a PWB 400 that includes a plurality of PWB-embedded capacitors 100. In the exemplary embodiment, a portion 405 of PWB 400 is allocated to electronic components 410, such as memory devices, logic gates, and/or integrated circuits (ICs). Available areas in PWB 400 may be determined 305 (shown in FIG. 3) at least in part by identifying one or more portions of PWB 400 that are not allocated to electronic components 410. Available areas may therefore represent portions of PWB 400 that are unused.

Each embedded capacitor 100 occupies a portion of the planar area of PWB 400 and is mounted (e.g., soldered) to a surface of PWB 400. In an exemplary embodiment, first conductive plates 115 (shown in FIG. 1) of a first embedded capacitor 415 are electrically coupled to each other by first conductive vias 140. Second conductive plates 120 (shown in FIG. 1) are electrically coupled to each other by second conductive vias 145. Coupling conductive plates 115, 120 with multiple vias 140, 145 facilitates reducing the inductance of embedded capacitor 100 and may therefore enable the use of capacitor 100 at frequencies higher than the frequencies at which conventional capacitors are operable.

First conductive vias 140 are electrically coupled to an electronic component 410 by a first conductor 420, and second conductive vias 145 are electrically coupled to the electronic component 410 by a second conductor 425. In one embodiment, first conductor 420 and second conductor 425 are traces extending across a portion of an internal non-conductive layer or a portion of the external surface of PWB 400. Such traces may electrically couple any number of electronic components 410 and/or embedded capacitors 100 to each other.

In the exemplary embodiment, first embedded capacitor 415 stores an electric charge provided by first conductor 420 and/or second conductor 425 as an electric field between first conductive plates 115 and second conductive plates 120. First embedded capacitor 415 may subsequently discharge an electric charge through first conductor 420 and/or second conductor 425.

Embedded capacitors 100 may have any shape suitable for use with the methods described herein. For example, first embedded capacitor 415 is rectangular. A second embedded capacitor 435 is L-shaped, enabling second embedded capacitor 435 to provide substantially a maximum possible capacitance within an available area outside the portion 405 of PWB allocated to electronic components 410.

Embedded capacitors 100 may be created using materials that are similar or identical to the materials used to create PWB 400. As a result, embedded capacitors 100 may exhibit thermal expansion that is similar or identical to the thermal expansion exhibited by PWB 400. Accordingly, embedded capacitors 100 facilitate reducing the physical stress applied to first conductor 420 and second conductor 425 as the operating temperature of PWB 400 changes.

Figure 5:
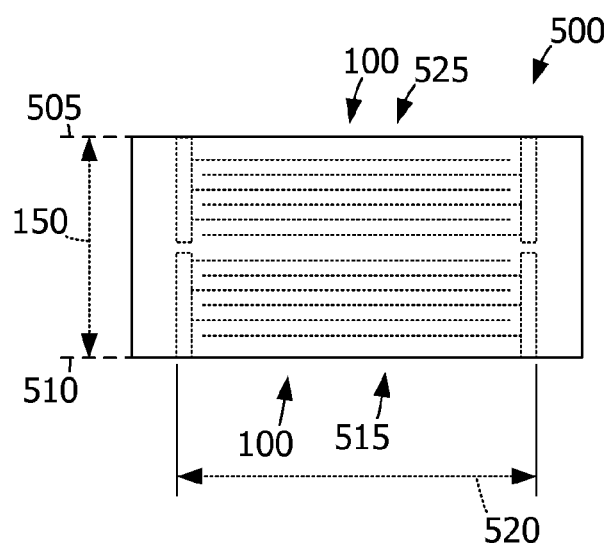
FIG. 5 is a diagram of a cross-section of an alternate PWB with a plurality of embedded capacitors.

Some embodiments facilitate stacking embedded capacitors 100. FIG. 5 is a diagram of a cross-section of an alternate PWB 500 with a plurality of embedded capacitors 100 in accordance with one embodiment. PWB 500 has a top surface 505 and a bottom surface 510, with a thickness 150 defined therebetween. A first embedded capacitor 515 occupies a planar area 520 within PWB 500 and extends from bottom surface 510 to approximately half the thickness 150 of PWB 500.

A second embedded capacitor 525 occupies substantially the same planar area 520 that is occupied by first embedded capacitor 515. Second embedded capacitor 525 extends from top surface 505 approximately half the thickness 150 of PWB 500 but is not in direct contact with first embedded capacitor 515. For example, one or more layers of non-conductive material may separate second embedded capacitor 525 from first embedded capacitor 515. First embedded capacitor 515 may occupy any portion of thickness 150, and second embedded capacitor 525 may extend approximately up to the remainder of thickness 150.

In another embodiment, first embedded capacitor 515 extends through substantially all of thickness 150, thereby occupying substantially all of PWB 500. Second capacitor 525 is embedded within a second PWB (not shown) similar to PWB 500, the conductive vias of first capacitor 515 are electrically coupled to the conductive vias of second capacitor 525. For example, second capacitor 525 may be mounted to top surface 505 of first capacitor 515, and bottom surface 510 of first capacitor 515 may be mounted to a PWB including electronic components, such as PWB 400 (shown in FIG. 4).

Embodiments provided herein facilitate embedding within a PWB one or more multi-plate capacitors with multiple conductive vias. Such capacitors may be mounted to another PWB, and the attributes of such an embedded capacitor may be selected to achieve a desired capacitance. Further, multiple capacitors, each embedded in a PWB, may be stacked and mounted to a PWB that includes electronic components, such as integrated circuits, and the electronic components may be electrically coupled to the embedded capacitors. Accordingly, embodiments described herein enable inexpensively and efficiently packaging capacitors that exhibit low inductance and thermal properties similar to those of the PWBs to which the capacitors are mounted. Embodiments provided herein further facilitate creating a PWB-embedded capacitor of a shape and size that are based on unallocated area within a PWB to which the capacitor is to be mounted.

The methods and systems described herein are not limited to the specific embodiments described herein. For example, components of each system and/or steps of each method may be used and/or practiced independently and separately from other components and/or steps described herein. In addition, each component and/or step may also be used and/or practiced with other apparatus and methods.

While the invention has been described in terms of various specific embodiments, those skilled in the art will recognize that the invention may be practiced with modification within the spirit and scope of the claims.

What is claimed is:

1. A printed wiring board (PWB) defining a substantially planar area comprising:
   a first portion comprising a second PWB mounted to a first surface of the PWB, wherein the first surface comprises an external exposed surface of the PWB, wherein the second PWB comprises:

a first conductive plate oriented substantially parallel to the planar area and extending from a first normal axis towards a second normal axis, wherein the first and second normal axes are oriented substantially perpendicular to the planar area;

a second conductive plate oriented substantially parallel to the planar area and extending from the second normal axis towards the first normal axis, wherein the second conductive plate extends between an adjacent pair of the first conductive plates;

a non-conductive material extending between the second conductive plate and the first conductive plate; and a first conductive via aligned substantially collinear with the first normal axis and in contact with at least one of the first conductive plate; and a second portion comprising one or more electronic components mounted to the first surface of the PWB.

2. The PWB of claim 1, further comprising a second conductive via aligned substantially collinear with the second normal axis and in contact with the second conductive plate.

3. The PWB of claim 1, wherein the non-conductive material is further disposed between the first conductive plate and the second normal axis, and between the second conductive plate and the first normal axis.

4. The PWB of claim 1, further comprising:
a first set of conductive plates, wherein each conductive plate in the first set of conductive plates is configured in a manner similar to the first conductive plate; and
a second set of conductive plates, wherein each conductive plate in the second set of conductive plates is configured in a manner similar to the second conductive plate, wherein each conductive plate in the second set of conductive plates is interleaved with each conductive plate in the second set of conductive plates.

5. The PWB of claim 4, wherein the first set of conductive plates includes between 4 and 40 conductive plates, and the second set of conductive plates includes between 4 and 40 conductive plates.

6. The PWB of claim 4, wherein the first set of conductive plates and the second set of conductive plates are stacked to a height substantially equal to a thickness of the PWB.

7. The PWB of claim 1, wherein the first conductive plate is configured to be electrically coupled to an electronic component of the one or more electronic components by a first conductor, wherein the second conductive plate is configured to be electrically coupled to the electronic component of the one or more electronic components by a second conductor.

8. A system, comprising:
a printed wiring board (PWB)-embedded capacitor, comprising first materials that exhibit common thermal expansion characteristics with second materials utilized to create a first PWB, wherein the PWB-embedded capacitor comprises:
a first conductive plate extending from a first normal axis towards a second normal axis, wherein the first normal axis and the second normal axis are oriented substantially perpendicular to a planar area of the first PWB;
a second conductive plate extending from the second normal axis towards the first normal axis and interleaved with the first conductive plate;
a non-conductive material disposed between the first conductive plate and the second conductive plate; and
a first conductive via coupled to the first conductive, wherein the PWB-embedded capacitor comprises a second PWB sized specifically to be placed in a defined location on an external exposed surface of the first PWB.

9. The system of claim 8, further comprising a second conductive via coupled to the second conductive plate.

10. The system of claim 9, wherein the first conductive via is configured to be coupled to a first conductor, wherein the second conductive via is configured to be coupled to a second conductor.

11. The system of claim 8, comprising a second PWB-embedded capacitor mounted to the PWB-embedded capacitor in a stacked orientation.

12. The system of claim 8, wherein each of the first conductive plate and the second conductive plate extends across a portion of a layer of the non-conductive material.

13. The system of claim 8, comprising:
a first set of conductive plates, wherein each conductive plate in the first set of conductive plates is configured in a manner similar to the first conductive plate, wherein the first set of conductive plates includes between 4 and 40 conductive plates; and
a second set of conductive plates, wherein each conductive plate in the second set of conductive plates is configured in a manner similar to the second conductive plate, wherein the second set of conductive plates includes between 4 and 40 second conductive plates.

14. The system of claim 8, wherein the non-conductive material is a dielectric.

15. A method, comprising:
generating a printed wiring board (PWB)-embedded capacitor, wherein the PWB-embedded capacitor is generated based at least in part on the physical characteristics of an external surface of a PWB, wherein generating the PWB-embedded capacitor comprises:
creating a plurality of first substantially overlapping conductive plates within a second PWB;
creating a plurality of second substantially overlapping conductive plates within the second PWB, wherein the second conductive plates are interleaved with the first conductive plates and substantially overlap the first conductive plates;
positioning a non-conductive material between the first conductive plates and the second conductive plates such that the first conductive plates do not contact the second conductive plates; and
electrically coupling the first conductive plates with a first conductive via.

16. The method of claim 15, wherein generating the printed wiring board (PWB)-embedded capacitor comprises determining, based on a desired capacitance, at least one of dimensions of the first conductive plates and the second conductive plates, a quantity of the first conductive plates and the second conductive plates, and a spacing between the first conductive plates and the second conductive plates based on the physical characteristics of the PWB.

17. The method of claim 15, comprising electrically coupling the second conductive plates with a second conductive via.

18. The method of claim 15, comprising coupling the PWB-embedded capacitor to the PWB.

19. The method of claim 18, comprising
electrically coupling the first conductive via to an electronic component coupled to the PWB.

20. The method of claim 15, comprising embedding in the second PWB a capacitor including a plurality of third conductive plates, a plurality of fourth conductive plates, a third conductive via electrically coupling the third conductive plates, and a fourth conductive via electrically coupling the fourth conductive plates.

* * * * *

UNITED STATES PATENT AND TRADEMARK OFFICE
CERTIFICATE OF CORRECTION

| | |
|---|---|
| PATENT NO. | : 8,717,773 B2 |
| APPLICATION NO. | : 13/040841 |
| DATED | : May 6, 2014 |
| INVENTOR(S) | : Daniel Z. Abawi |

It is certified that error appears in the above-identified patent and that said Letters Patent is hereby corrected as shown below:

In the Claims:

In column 7, line 64, in Claim 8, should read "a first conductive via coupled to the first conductive plate,".

Signed and Sealed this
Twentieth Day of October, 2015

Michelle K. Lee
*Director of the United States Patent and Trademark Office*